(12) United States Patent
Nakamura

(10) Patent No.: US 11,264,312 B2
(45) Date of Patent: Mar. 1, 2022

(54) NON-INSULATED POWER MODULE

(71) Applicant: Mitsubishi Electric Corporation, Tokyo (JP)

(72) Inventor: Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/931,945

(22) Filed: Jul. 17, 2020

(65) Prior Publication Data
US 2021/0118780 A1  Apr. 22, 2021

(30) Foreign Application Priority Data

Oct. 21, 2019 (JP) .............................. JP2019-191900

(51) Int. Cl.
| H01L 23/495 | (2006.01) |
| H01L 23/367 | (2006.01) |
| H01L 23/40 | (2006.01) |
| H01L 25/07 | (2006.01) |
| H01L 23/00 | (2006.01) |
| H01L 25/18 | (2006.01) |

(52) U.S. Cl.
CPC ...... *H01L 23/49575* (2013.01); *H01L 23/367* (2013.01); *H01L 23/4006* (2013.01); *H01L 24/48* (2013.01); *H01L 25/072* (2013.01); *H01L 25/18* (2013.01); *H01L 2224/48137* (2013.01); *H01L 2924/151* (2013.01); *H01L 2924/181* (2013.01)

(58) Field of Classification Search
None
See application file for complete search history.

(56) References Cited

U.S. PATENT DOCUMENTS

| 2002/0160552 A1* | 10/2002 | Minamio | H01L 23/3107 |
| | | | 438/108 |
| 2014/0027891 A1* | 1/2014 | Kimura | H01L 21/561 |
| | | | 257/675 |
| 2014/0293548 A1 | 10/2014 | Besshi et al. | |
| 2015/0102479 A1* | 4/2015 | Fuergut | H01L 23/3157 |
| | | | 257/706 |

FOREIGN PATENT DOCUMENTS

WO  2013/099545 A1  7/2013

* cited by examiner

*Primary Examiner* — Michelle Mandala
*Assistant Examiner* — Jordan M Klein
(74) *Attorney, Agent, or Firm* — Studebaker & Brackett PC

(57) ABSTRACT

An object of the present invention is to achieve both securing an insulation distance and securing a chip mounting area in a non-insulated power module. A non-insulated power module includes a plurality of die pads, a plurality of semiconductor chips mounted on upper surfaces of the plurality of die pads, and a package sealing the semiconductor chips, in which lower surfaces of the plurality of die pads are exposed from a lower surface of the package, on the lower surface of the package, first grooves are formed in areas between the plurality of die pads, and the plurality of die pads have a trapezoidal cross-sectional shape in the thickness direction, in which an area of an upper surface is larger than an area of the lower surface.

8 Claims, 9 Drawing Sheets

F I G. 4
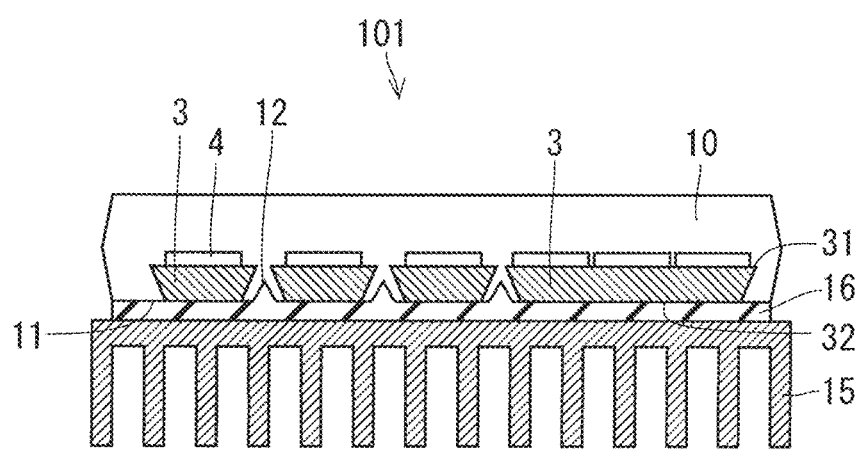

NON-INSULATED POWER MODULE

BACKGROUND OF THE INVENTION

Field of the Invention

The present invention relates to a non-insulated power module.

Description of the Background Art

In a non-insulated module, the die pad on which the power chip is mounted is exposed from the lower surface of the package. Heat radiation fins are attached to the lower surface of the package. At this point, a flexible insulating member is necessary to be entered between the package and the heat radiation fins in order to insulate the die pad exposed from the lower surface of the package and the heat radiation fins. WO2013/099545 discloses that in a non-insulated module, a recess is provided on the lower surface of the package in order to secure an insulation distance between the die pad and the heat radiation fins.

By providing a groove on the lower surface of the package between a plurality of die pads exposed from the lower surface of the package, the insulation distance between the die pads and the heat radiation fins can be secured. However, when such a structure is adopted, there is a problem that the chip mounting area of the die pad is reduced.

SUMMARY

An object of the present invention is to achieve both securing an insulation distance and securing a chip mounting area in a non-insulated power module.

A non-insulated power module of the present invention includes a plurality of die pads, a plurality of semiconductor chips, and a package. The plurality of semiconductor chips are mounted on upper surfaces of the plurality of die pads. The package seals the plurality of semiconductor chips. The lower surfaces of the plurality of die pads are exposed from a lower surface of the package. On the lower surface of the package, first grooves are formed in areas between the plurality of die pads. The plurality of die pads have a trapezoidal cross-sectional shape in a thickness direction, and an area of the upper surface is larger than the area of the lower surface.

In the non-insulated power module of the present invention, the first grooves are formed on the lower surface of the package in the area between the plurality of die pads; therefore, with insulating member entering into the first grooves when the heat radiation fins are attached to the lower surface of the package via the insulating member, the insulation distance between the die pads becomes longer, and the dielectric tolerance is improved. Further, the plurality of die pads have a trapezoidal cross-sectional shape in which the area of the upper surface is larger than the area of the lower surface; therefore, even if the areas of the lower surfaces of the die pads become smaller due to the formation of the first grooves on the lower surface of the package, the upper surfaces of the die pads, that is, the areas of the chip mounting areas can be secured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a cross-sectional view illustrating a state in which heat radiation fins are attached to the non-insulated power module of Embodiment 1;

DESCRIPTION OF THE PREFERRED EMBODIMENTS

A. Embodiment 1

Figure 1:
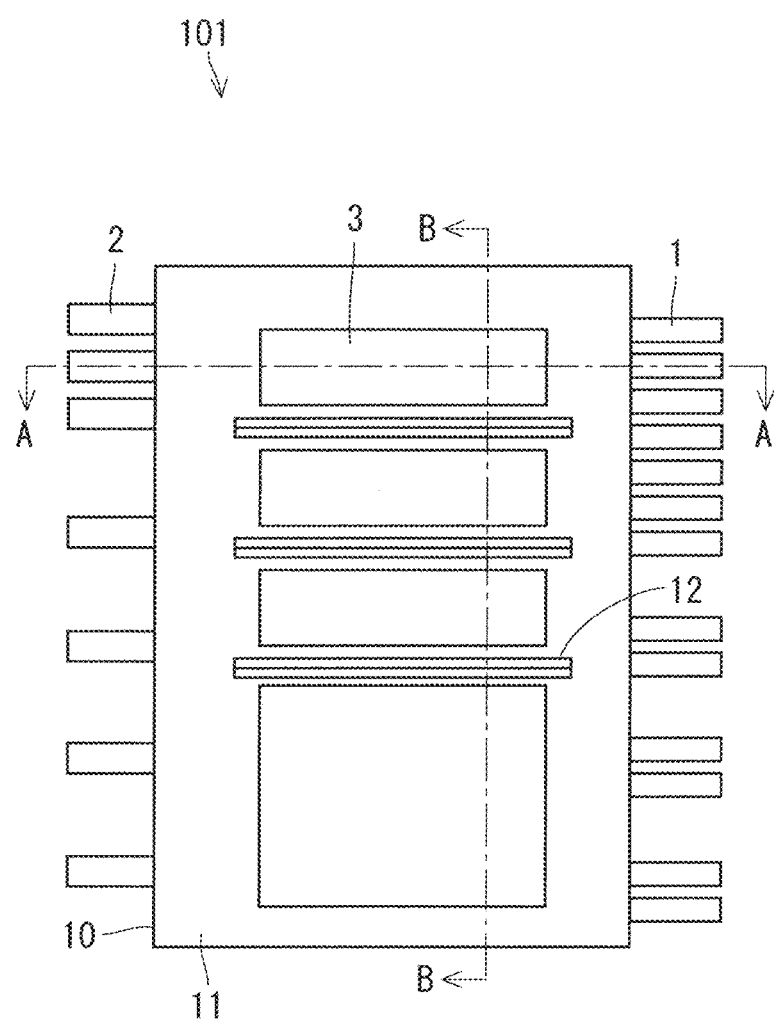
FIG. 1 is a plan view of a non-insulated power module according to Embodiment 1 as viewed from below.
Figure 2:
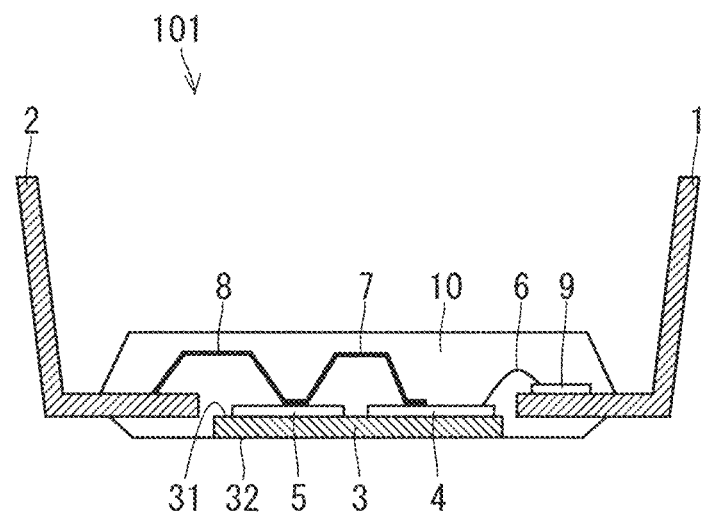
FIG. 2 is a cross-sectional view taken along the line A-A in FIG. 1 of the non-insulated power module of Embodiment 1.
Figure 3:
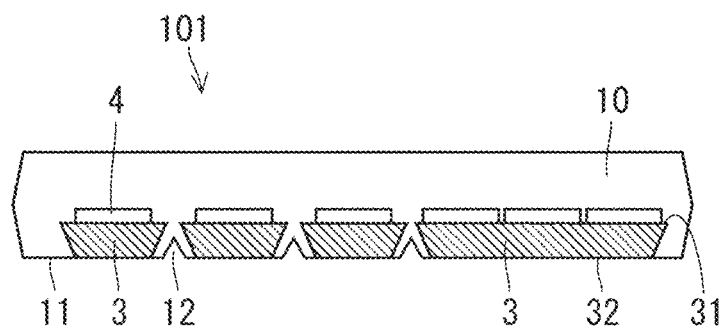
FIG. 3 is a cross-sectional view taken along the line B-B in FIG. 1 of the non-insulated power module of Embodiment 1.

FIG. 1 is a plan view of a non-insulated power module 101 according to Embodiment 1 as viewed from below. FIG. 2 is a cross-sectional view taken along the line A-A in FIG. 1 of the non-insulated power module 101. FIG. 3 is a cross-sectional view taken along the line B-B in FIG. 1 of the non-insulated power module 101. Hereinafter, the configuration of the non-insulated power module 101 will be described with reference to FIGS. 1 to 3.

The non-insulated power module 101 includes leads 1, 2, die pads 3, Insulated Gate Bipolar Transistor (IGBT) chips 4, Free Wheeling Diode (FWD) chips 5, a control Integrated Circuit (IC) 9, input wires 6, inter-chip wires 7, output wires 8, and a package 10.

Of the lead frame, the portions protruding from the side surface of the package 10 and functioning as external connection terminals are the leads 1 and 2, and the portion on which the semiconductor chip is mounted is the die pad 3. The lead frame is a metal thin plate processed into a wiring shape.

The die pad 3 has the IGBT chip 4 and the FWD chip 5 mounted on its upper surface 31. The upper surface 31 of the die pad 3 is also referred to as a chip mounting surface. As illustrated in FIG. 1, the non-insulated power module 101 includes four die pads 3. In FIG. 1, the IGBT chip 4 and FWD chip 5 for each phase of the lower arm are mounted on the die pads 3 from the top to the third, and the IGBT chips 4 and the FWD chips 5 for the three phases of the upper arm are mounted on the lowest die pad 3 in FIG. 1. The IGBT chip 4 performs on/off switching of the main current. The control IC 9 controls switching of the IGBT chip 4. The FWD chip 5 supplies a return current when the IGBT chip 4 is switched off. These semiconductor chips are bonded to the upper surface 31 of the die pad 3 with a bonding material such as solder.

The semiconductor chips and the lead frames are connected by conductive wires. The control IC 9 and the IGBT chip 4 are connected by the input wire 6. The IGBT chip 4 and the FWD chip 5 are connected by the inter-chip wire 7. The FWD chip 5 and the lead 2 are connected by the output wire 8. The die pad 3 also serves as an external connection terminal of the collector electrode of the IGBT chip 4. The emitter electrode of the IGBT chip 4 is connected to the lead 2 by the inter-chip wire 7 and the output wire 8. The IGBT chips 4 mounted on each die pad 3 perform switching at different timings; therefore, a high potential difference of several hundred to one thousand and several hundred volts is generated between the die pads 3.

The IGBT chip 4, the FWD chip 5, the control IC 9, the input wire 6, the inter-chip wire 7, and the output wire 8 are sealed in the package 10. The package 10 is formed by curing the sealing resin. A lower surface 32 of the die pad 3 is exposed from a lower surface 11 of the package 10. On the lower surface 11 of the package 10, grooves 12 are formed in the areas between the die pads 3. The groove 12 is also referred to as a first groove.

FIG. 4 is a cross-sectional view illustrating a state in which heat radiation fins 15 are attached to the non-insulated power module 101. The heat radiation fins 15 are attached to the lower surface 11 of the package 10 via a flexible insulating member 16. The heat from the die pad 3 is transferred from the lower surface 32 to the heat radiation fins 15 via the insulating member 16 and radiated from the heat radiation fins 15. Therefore, the lower surface 32 of the die pad 3 is also referred to as a heat dissipation surface. The insulating member 16 has flexibility enough to enter into the grooves 12 when sandwiched between the lower surface 11 of the package 10 and the heat radiation fins 15. With the entrance of the insulating member 16 into the grooves 12, the insulation distance between the die pads 3 is secured, and the dielectric tolerance between the die pads 3 is improved.

As illustrated in FIGS. 3 and 4, in the die pad 3, the area of the upper surface 31 is larger than the area of the lower surface 32, and the sectional shape in the thickness direction is trapezoidal. Therefore, the reduction of the area of the upper surface 31 due to the formation of the grooves 12 in the lower surface 11 of the package 10 is suppressed. As described above, according to the non-insulated power module 101, reduction in the chip mounting area is prevented while securing the insulation distance between the die pads 3 where the potential difference occurs.

Note that, in FIGS. 1 to 4, although a 6 in 1 Intelligent Power Module (IPM) is illustrated as an example of the non-insulated power module 101, Embodiment 1 is also applicable to other non-insulated power modules. For example, the semiconductor chip mounted on the die pad 3 may be a Metal-Oxide-Semiconductor Field-Effect Transistor (MOSFET) chip or a Schottky Barrier Diode (SBD) chip instead of the IGBT chip.

The non-insulated power module 101 of Embodiment 1 includes a plurality of die pads 3, a plurality of semiconductor chips mounted on the upper surfaces 31 of the plurality of die pads 3, and the package 10 that seals the semiconductor chips. The lower surfaces 32 of the plurality of die pads 3 are exposed from a lower surface 11 of the package 10. On the lower surface 11 of the package 10, the grooves 12 are formed in the areas between the plurality of die pads 3. Hereby, the insulation distance is secured with the entrance of the insulating member 16 into the grooves 12 when the heat radiation fins 15 are attached to the non-insulated power module 101; therefore, the dielectric tolerance between the die pads 3 is improved. Further, the plurality of die pads 3 have a trapezoidal cross-sectional shape in the thickness direction, and the area of the upper surface 31 is larger than the area of the lower surface 32; therefore, the reduction in the area of the upper surface 31, that is, the chip mounting surface due to providing the grooves 12 on the lower surface 11 of the package 10 is suppressed.

B. Embodiment 2

Figure 5:
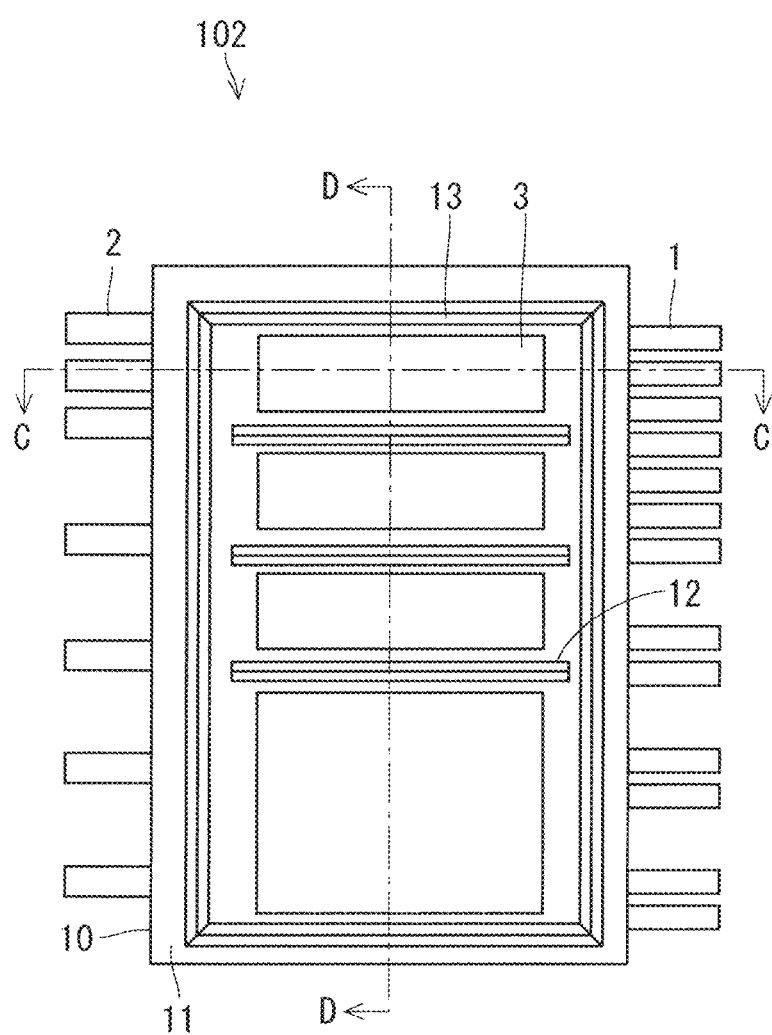
FIG. 5 is a plan view of a non-insulated power module according to Embodiment 2 as viewed from below.
Figure 6:
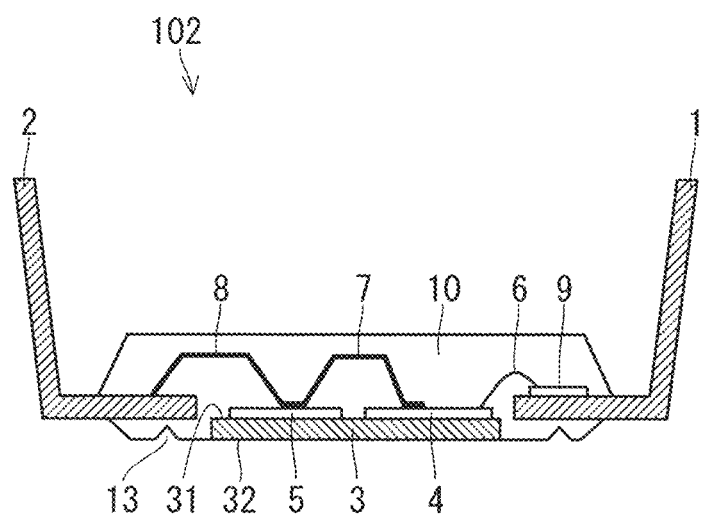
FIG. 6 is a cross-sectional view taken along the line C-C in FIG. 4 of the non-insulated power module of Embodiment 2.
Figure 7:
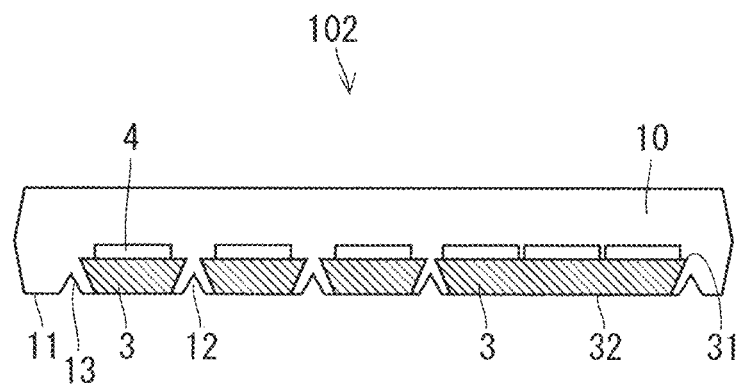
FIG. 7 is a cross-sectional view taken along the line D-D in FIG. 4 of the non-insulated power module of Embodiment 2.

FIG. 5 is a plan view of a non-insulated power module 102 according to Embodiment 2 as viewed from below. FIG. 6 is a cross-sectional view taken along the line C-C in FIG. 5 of the non-insulated power module 102. FIG. 7 is a cross-sectional view taken along the line D-D in FIG. 5 of the non-insulated power module 102.

The non-insulated power module 102 has a groove 13 in addition to the grooves 12 formed on the lower surface 11 of the package 10, and the configuration other than this configuration is the same as that of the non-insulated power module 101 of Embodiment 1. The groove 13 is also referred to as a second groove. The groove 13 is formed on the lower surface 11 of the package 10 in a region surrounding the lower surfaces 32 of all the die pads 3.

Figure 8:
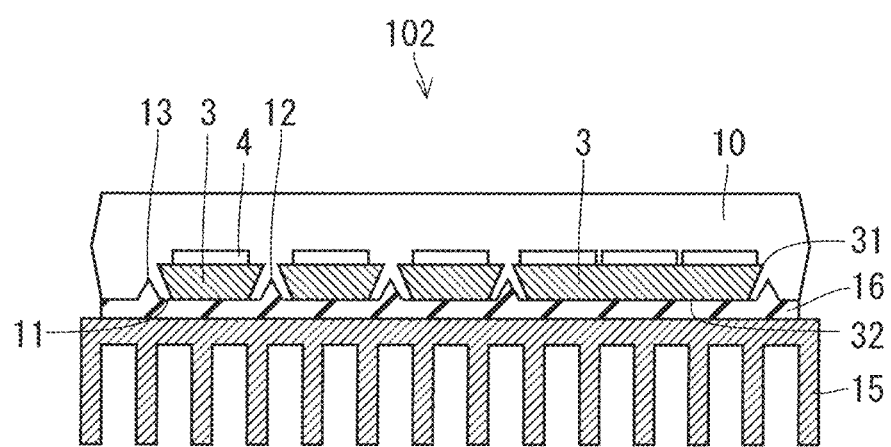
FIG. 8 is a cross-sectional view illustrating a state in which heat radiation fins are attached to the non-insulated power module of Embodiment 2.

FIG. 8 is a cross-sectional view illustrating a state in which heat radiation fins 15 are attached to the non-insulated power module 102. The heat radiation fins 15 are attached to the lower surface 11 of the package 10 via a flexible insulating member 16. With the entrance of the insulating member 16 into the groove 13, moisture is suppressed from entering the lower surfaces 32 of the die pads 3 from the interface between the lower surface 11 of the package 10 and the insulating member 16. Therefore, the reliability of the non-insulated power module 102 is improved.

C. Embodiment 3

Figure 9:
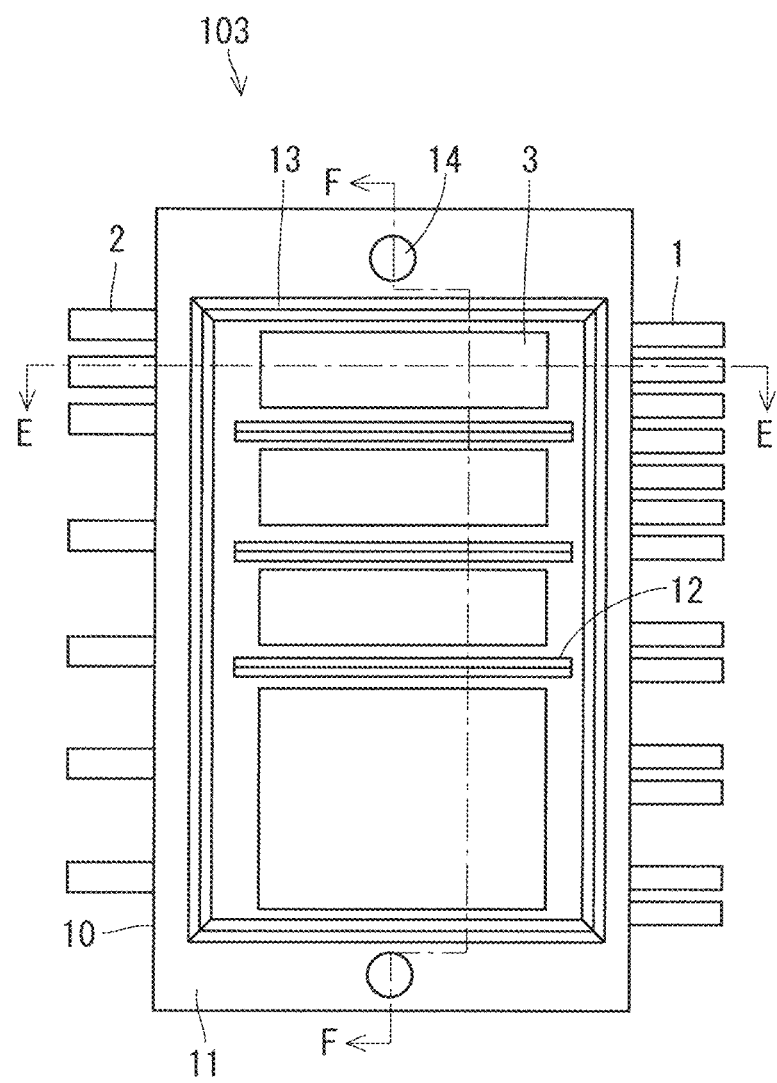
FIG. 9 is a plan view of a non-insulated power module according to Embodiment 3 as viewed from below.
Figure 10:
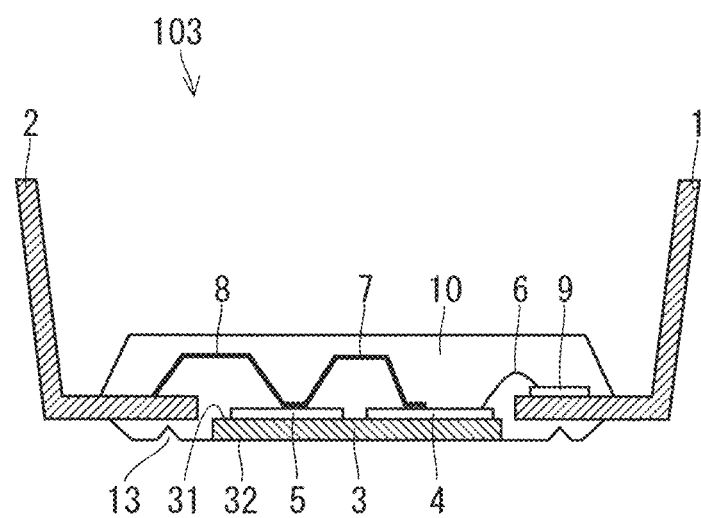
FIG. 10 is a cross-sectional view taken along the line E-E in FIG. 7 of the non-insulated power module of Embodiment 3.
Figure 11:
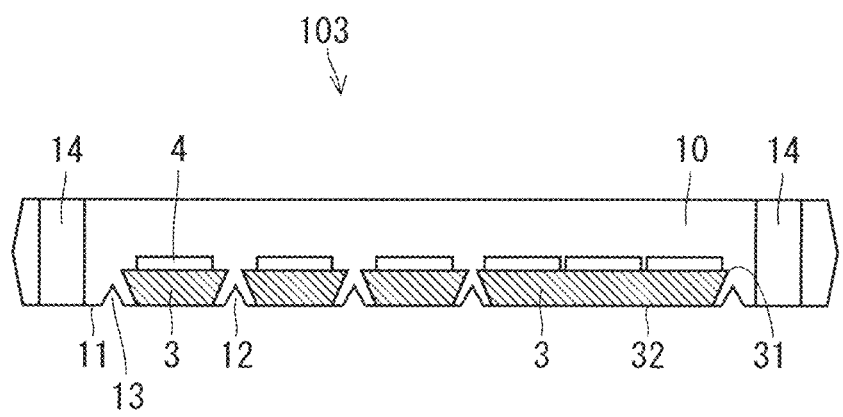
FIG. 11 is a cross-sectional view taken along the line F-F in FIG. 7 of the non-insulated power module of Embodiment 3.

FIG. 9 is a plan view of a non-insulated power module 103 according to Embodiment 3. FIG. 10 is a cross-sectional view taken along the line E-E in FIG. 9 of the non-insulated power module 103. FIG. 11 is a cross-sectional view taken along the line F-F in FIG. 9 of the non-insulated power module 103.

In the non-insulated power module 103, screw holes 14 extending through the package 10 in a thickness direction are provided on the outer peripheral side from the groove 13 of the package 10, and the configuration other than this configuration is the same as that of the non-insulated power module 102 of Embodiment 2. In other words, the grooves 12 and the groove 13 are provided on the inner side of the package 10 than the screw holes 14. The screw holes 14 are for attaching the heat radiation fins 15 to the package 10.

Figure 12:
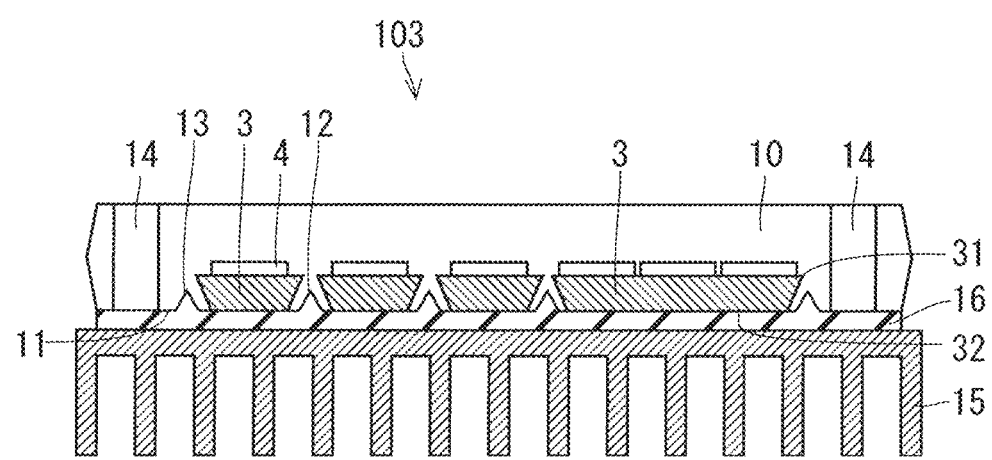
FIG. 12 is a cross-sectional view illustrating a state in which heat radiation fins are attached to the non-insulated power module of Embodiment 3.

FIG. 12 is a cross-sectional view illustrating a state in which heat radiation fins 15 are attached to the non-insulated power module 103. Although the package 10 and the heat radiation fins 15 are fixed with the screws inserted into the screw holes 14, the screws are omitted in FIG. 12. The heat radiation fins 15 are attached to the lower surface 11 of the package 10 via a flexible insulating member 16. With the entrance of the insulating member 16 into the groove 13, the longer insulation distance between the outermost die pad 3 and the screw is secured, and the dielectric tolerance therebetween is improved.

It should be noted that Embodiments of the present invention can be arbitrarily combined and can be appropriately modified or omitted without departing from the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A non-insulated power module comprising:
   a plurality of die pads arranged along a first direction;
   a plurality of semiconductor chips mounted on upper surfaces of the plurality of die pads; and
   a package sealing the plurality of semiconductor chips, wherein
   lower surfaces of the plurality of die pads are exposed from a lower surface of the package,
   on the lower surface of the package, first grooves are formed to extend in one direction parallel to the lower surfaces of die pads in areas between the plurality of die pads, and
   the plurality of die pads have a trapezoidal cross-sectional shape in a thickness direction only when viewed from the first direction, in which an area of an upper surface is larger than an area of the lower surface.

2. The non-insulated power module according to claim 1, wherein
   on the lower surface of the package, a second groove is formed in a region surrounding the plurality of die pads.

3. The non-insulated power module according to claim 2, wherein
   a screw hole extending through the package in a thickness direction and provided on an outer peripheral side from the second groove of the package is formed, the screw hole being for attaching heat radiation fins to the package.

4. The non-insulated power module according to claim 3, wherein
   the heat radiation fins are attached to the lower surface of the package via an insulating member.

5. The non-insulated power module according to claim 2, wherein
   heat radiation fins are attached to the lower surface of the package via an insulating member.

6. The non-insulated power module according to claim 1, wherein
   heat radiation fins are attached to the lower surface of the package via an insulating member.

7. The non-insulated power module according to claim 1, wherein
   one first groove is between each pair of die pads of the plurality of die pads.

8. The non-insulated power module according to claim 1, wherein
   the one direction parallel to the lower surfaces of die pads is perpendicular to the first direction.

* * * * *